US011714111B2

(12) United States Patent
Fritz et al.

(10) Patent No.: US 11,714,111 B2
(45) Date of Patent: Aug. 1, 2023

(54) ISOLATION MEASUREMENT MONITORING FOR ASIL APPLICATIONS

(71) Applicant: SAMSUNG SDI CO., LTD., Yongin-si (KR)

(72) Inventors: Jürgen Fritz, Graz (AT); Peter Kurcik, Sankt Nikolai im Sausal (AT); Harald Reiter, Graz (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 1 day.

(21) Appl. No.: 17/591,489

(22) Filed: Feb. 2, 2022

(65) Prior Publication Data

US 2022/0260620 A1    Aug. 18, 2022

(30) Foreign Application Priority Data

Feb. 12, 2021  (EP) ..................................... 21156823
Jan. 20, 2022  (KR) ........................ 10-2022-0008572

(51) Int. Cl.
*G01R 27/02* (2006.01)
*G01R 27/14* (2006.01)

(52) U.S. Cl.
CPC ........... *G01R 27/025* (2013.01); *G01R 27/14* (2013.01)

(58) Field of Classification Search
CPC ............................. G01R 27/025; G01R 27/14
See application file for complete search history.

(56) References Cited

U.S. PATENT DOCUMENTS

| 7,576,547 | B2* | 8/2009 | Muller .................... G01R 27/18 324/555 |
| 8,537,510 | B2* | 9/2013 | Lehmann ............... G01R 31/52 361/48 |
| 11,581,590 | B2* | 2/2023 | Choi ..................... G01R 19/165 |
| 2007/0285102 | A1 | 12/2007 | Muller |
| 2012/0139549 | A1 | 6/2012 | Sufrin-Disler et al. |
| 2014/0084933 | A1 | 3/2014 | Jang et al. |
| 2014/0159908 | A1 | 6/2014 | Hong et al. |

(Continued)

FOREIGN PATENT DOCUMENTS

| CN | 108333548 A | 7/2018 |
| EP | 3182146 A1 | 6/2017 |

(Continued)

OTHER PUBLICATIONS

European Search Report issued in corresponding application No. EP 21156823.3, dated Aug. 9, 2021, 5 pages.

*Primary Examiner* — Judy Nguyen
*Assistant Examiner* — James Split
(74) *Attorney, Agent, or Firm* — Lewis Roca Rothgerber Christie LLP

(57) ABSTRACT

An electric circuit according to an embodiment of the present disclosure includes only a single amperemeter configured to measure either a positive current or a negative current through a respective measurement resistance between a respective high voltage potential and a common ground potential. The respective actual measurement resistance value of the unmeasured measurement resistance is calculated by applying a respectively calculated actual measurement resistance value of the respective measured measurement resistance, a calculated actual positive isolation resistance value, and a calculated negative isolation resistance value.

14 Claims, 1 Drawing Sheet

(56) References Cited

U.S. PATENT DOCUMENTS

2017/0176512 A1   6/2017  Pritelli et al.
2020/0088803 A1   3/2020  Park et al.

FOREIGN PATENT DOCUMENTS

| WO | WO 2012-078601 A1 | | 6/2012 | |
| --- | --- | --- | --- | --- |
| WO | WO 2020-126509 A1 | | 6/2020 | |
| WO | WO-2021051947 A1 | * | 3/2021 | ............. B60L 58/10 |
| WO | WO-2023006443 A1 | * | 2/2023 | |

\* cited by examiner

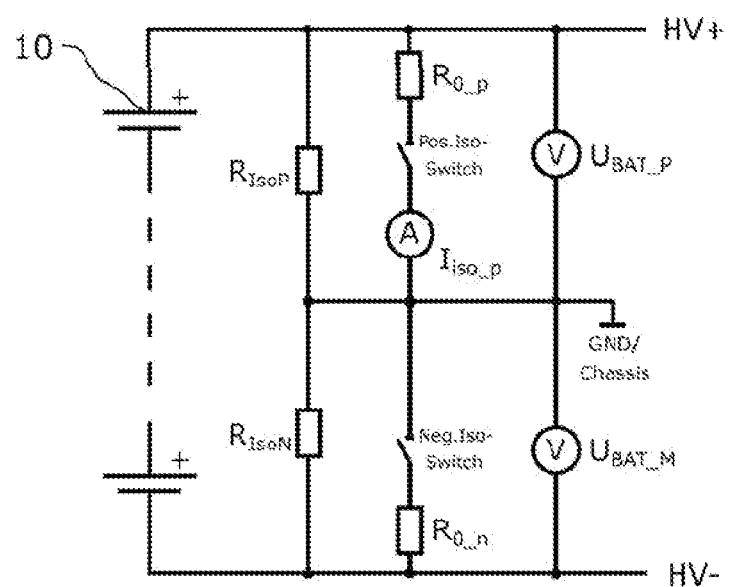

ISOLATION MEASUREMENT MONITORING FOR ASIL APPLICATIONS

CROSS-REFERENCE TO RELATED APPLICATION

This application claims priority to and the benefit of European Patent Application No. 21156823.3, filed in the European Patent Office on Feb. 12, 2021, and claims priority to Korean Application No. 10-2022-0008572, filed Jan. 20, 2022, the entire content of all of which is incorporated herein by reference.

BACKGROUND

1. Field

Aspects of embodiments of the present disclosure refer to an electric circuit for monitoring isolation resistance measurement within a high voltage board net of an electronic vehicle and to a corresponding method for monitoring such an isolation resistance measurement.

2. Description of Related Art

Within the high voltage (HV) board net of an electronic vehicle (EV), such as in an plug-in-hybrid electronic vehicle (PHEV), the functional safety goal for measuring the isolation resistance(s) of included power systems is often an assessment with Automotive Safety Integrity Level A (ASIL A) or higher. These assessments are defined in ISO 26262, titled "Road vehicles—Functional safety", which is an international standard for functional safety of electrical and/or electronic systems in production automobiles.

Power systems generally have to comply with the elementary standard ECE R100 for electromobility, which describes uniform regulations for vehicle systems. The standard requires, besides measuring the isolation resistance(s) of power systems, monitoring said measuring. It may be possible to realize an isolation resistance monitor (also referred to as an iso-monitor) that is ASIL A compliant in many ways. One approach for iso-monitoring in general is to apply the method described in Annex 4A of ECE R100.

This method of monitoring isolation resistance measurement requires two high voltage measurements and two current measurements. However, any measurement imposes certain costs, complex hardware and software design, and significant design efforts, including to ensure that the required accuracy and behaviour is achieved.

SUMMARY

According to aspects and features of the present disclosure, at least some of the drawbacks of the related art are overcome or mitigated and isolation resistance monitoring according to the ECE R100 standard that is also ASIL A compliant but uses a reduced number of measurements compared to the related art techniques is provided.

Embodiments of the present disclosure provide an electric circuit for monitoring isolation resistance measurement within the HV board net of an electronic vehicle and a corresponding method for monitoring an isolation resistance measurement.

An electric circuit according to an embodiment of the present disclosure includes a HV power system providing a positive high voltage potential and a negative high voltage potential with a common ground potential defined in the middle between a positive isolation resistance and a negative isolation resistance. The positive isolation resistance and the negative isolation resistance are connected in series and parallel to the HV power system between the positive high voltage potential and the negative high voltage potential.

The electric circuit further includes a positive measurement resistance connected in parallel to the positive isolation resistance between the positive high voltage potential and the ground potential; a negative measurement resistance connected in parallel to the negative isolation resistance between the negative high voltage potential and the ground potential; a positive voltage meter between the positive high voltage potential and the ground potential; and a negative voltage meter between the negative high voltage potential and the ground potential.

Furthermore, the electric circuit includes only a single amperemeter configured (e.g., permanently configured) to measure either a positive current $I_{iso\_p}$ through the positive measurement resistance between the positive high voltage potential and the ground potential or a negative current $I_{iso\_n}$ through the negative measurement resistance between the negative high voltage potential and the ground potential.

The HV power system may be, for example, a battery system (e.g., a rechargeable energy storage system, RESS) or a supply system. In some embodiments, the high voltage potentials or their potential difference is ±48 volts, ±60 volts, ±200 volts, ±400 volts, or ±600 volts. However, the high voltage potentials can be any voltage higher than 6 volts (absolute value).

The terms positive and negative are used herein as identifiers for components or variables which are located in the respective section of the electric circuit, e.g., in the section related to the positive high voltage potential and in the section related to the negative high voltage potential. Thus, positive currents and negative currents are currents related to the respective positive and negative sections of the electric circuit. The terms do not refer to the algebraic sign of any of these currents.

In an electric circuit according to an embodiment of the present disclosure, only a single amperemeter is present. Therefore, the number of components is reduced compared to related art electric circuits for monitoring isolation resistance measurement within the HV board net of an electronic vehicle. Because one amperemeter can be omitted in an electric circuit according to embodiments of the present disclosure, the costs and complexity of the isolation resistance monitor system can be reduced.

The present disclosure is based on the idea that a second amperemeter is not required (and may be omitted) because the related art measurement approach is overdetermined with respect to the two measured currents. All required parameters can be determined with a single current measurement, e.g., a measurement of a positive current $I_{iso\_p}$ through the positive measurement resistance between the positive high voltage potential and the ground potential, or a negative current $I_{iso\_n}$ through the negative measurement resistance between the negative high voltage potential and the ground potential. For example, the disclosure provides isolation resistance monitoring with a cost- and effort-optimized diagnosis concept for ASIL applications which still complies with the ECE R100 standard.

In some embodiments, the positive current $I_{iso\_p}$ through the positive measurement resistance in relation to the ground potential can be controlled on or off by a positive switch Pos.Iso-Switch. In some embodiments, the negative current $I_{iso\_n}$ through the negative measurement resistance in relation to the ground potential can be controlled on or off by a negative switch Neg.Iso-Switch. The switches allow the respective isolation resistance measurement to be activated or deactivated and to individually control the positive isolation resistance measurement section and the negative isolation resistance measurement section of the electric circuit.

A method for monitoring isolation resistance measurement within the HV board net of an electronic vehicle with an electric circuit according to the disclosure includes measuring voltage (e.g., first voltage) $U_{BAT\_P}$ with the positive voltage meter between the positive high voltage potential and the ground potential as voltage drop across the positive isolation resistance and the positive measurement resistance connected in parallel; and measuring voltage (e.g., second voltage) $U_{BAT\_N}$ with the negative voltage meter between the negative high voltage potential and the ground potential as voltage drop across the negative isolation resistance and the negative measurement resistance connected in parallel. Then, the actual positive isolation resistance value $R'_{IsoP}$ may be calculated by applying a known nominal positive measurement resistance value $R_{0\_p}$ of the positive measurement resistance and the measured voltage $U_{BAT\_P}$; and the actual negative isolation resistance value $R'_{IsoN}$ may be calculated by applying a known nominal negative measurement resistance value $R_{0\_n}$ of the negative measurement resistance and the measured voltage $U_{BAT\_N}$. Further, the current $I_{iso\_p}$ or $I_{iso\_n}$ through either the positive measurement resistance or the negative measurement resistance may be measured with the single amperemeter and the respective actual measurement resistance value $R'_{0\_p}$ or $R'_{0\_n}$ of the measured positive measurement resistance or negative measurement resistance may be calculated; and the calculated respective actual measurement resistance value $R'_{0\_p}$ or $R'_{0\_n}$ of the measured positive measurement resistance or negative measurement resistance with the respective known nominal resistance value $R_{0\_p}$ or $R_{0\_n}$ may be calculated.

In some embodiments, the method further includes calculating the respective actual measurement resistance value $R'_{0\_n}$ or $R'_{0\_p}$ of the unmeasured negative measurement resistance or positive measurement resistance by applying the respective calculated actual measurement resistance value $R'_{0\_p}$ or $R'_{0\_n}$ of the measured positive measurement resistance or negative measurement resistance, the calculated actual positive isolation resistance value $R'_{IsoP}$ and the calculated negative isolation resistance value $R'_{IsoP}$; and comparing the calculated respective actual measurement resistance value $R'_{0\_n}$ or $R'_{0\_p}$ of the unmeasured negative measurement resistance or positive measurement resistance with the respective known nominal resistance value $R_{0\_n}$ or $R_{0\_p}$.

The actual isolation resistance values $R'_{IsoN}$ and $R'_{IsoN}$ are calculated (according to ECE R100) by applying the known nominal positive measurement resistance value $R_{0\_p}$ of the positive measurement resistance and the known nominal negative measurement resistance value $R_{0\_n}$ of the negative measurement resistance and the respective measured voltage of the corresponding high voltage potential section of the electric circuit.

The two isolation resistances may still be measured as in to the described related art method. However, monitoring the isolation resistance measurement can be done by diagnosing the actual measurement resistance values $R'_{0\_p}$ and/or $R'_{0\_n}$ of the two measurement resistances. The measured measurement resistance, e.g., the measurement resistance on which the current measurement was performed, can be simply calculated by dividing the respective measured voltage by the measured current and checked to determine if it is as it should be.

The calculation of the respective actual measurement resistance value $R'_{0\_n}$ or $R'_{0\_p}$ of the unmeasured negative measurement resistance or positive measurement resistance can be done by applying Ohm's and Kirchhoff's laws as all relevant values ($R'_{IsoP}$, $R'_{IsoN}$, $R_{0\_p}$ or $R_{0\_n}$, $U_{BAT\_P}$, $R_{BAT\_N}$) except the respective unmeasured measurement resistance value $R_{0\_n}$ or $R_{0\_p}$ are already known. The following formulas can be used for this calculation:

$$R'_{0\_p} = \frac{U_{BAT\_P}}{I_{iso\_p}} \text{ and}$$

$$R'_{0\_n} = \frac{R'_{0\_p} * R'_{IsoN} * R'_{IsoP} * U_{BAT\_M}}{R'_{0\_p} * R'_{IsoN} * U_{BAT\_P} + R'_{IsoN} * R'_{IsoP} *}, \text{ or}$$
$$U_{BAT\_P} - R'_{0\_p} * R'_{IsoP} * U_{BAT\_M}$$

$$R'_{0\_n} = \frac{U_{BAT\_M}}{I_{iso\_n}} \text{ and}$$

$$R'_{0\_p} = \frac{R'_{0\_n} * R'_{IsoP} * R'_{IsoN} * U_{BAT\_M}}{R'_{0\_n} * R'_{IsoP} * U_{BAT\_M} + R'_{IsoP} * R'_{IsoN} *}.$$
$$U_{BAT\_M} - R'_{0\_n} * R'_{IsoN} * U_{BAT\_P}$$

The method may be applied to the electric circuit when the positive switch and/or the negative switch is closed. When both switches are present and open, isolation resistance measurement is completely omitted.

Another embodiment of the present disclosure refers to a board net of an electronic vehicle including an electric circuit according to an above-described embodiment.

Another embodiment of the present disclosure refers to an electronic vehicle including an electric circuit according to an above-described embodiment.

Further embodiments of the present disclosure are described below and in the dependent claims.

The various embodiments of the present disclosure described herein can be combined with each other unless specified otherwise in the description of a particular embodiment.

BRIEF DESCRIPTION OF THE DRAWINGS

The present disclosure will be described in further detail by reference to the FIGURE. The examples given are provided to describe the present disclosure but are not intended to limit the present disclosure. In the drawings:

The FIGURE is a circuit diagram showing a circuit for monitoring isolation resistance measurement within the HV board net of an electronic vehicle according to an embodiment of the present disclosure.

DETAILED DESCRIPTION OF THE DISCLOSURE

Reference will now be made, in detail, to embodiments, examples of which are illustrated in the accompanying drawing. Aspects and features of the embodiments, and implementation methods thereof, will be described with reference to the accompanying drawing. Like reference numerals denote like elements, and redundant descriptions are omitted. As used herein, the term "and/or" includes any and all combinations of one or more of the associated listed items. Further, the use of "may" when describing embodiments of the present disclosure refers to "one or more embodiments of the present disclosure."

It will be understood that although the terms "first," "second," etc. are used to describe various elements, these elements should not be limited by these terms. These terms are only used to distinguish one element from another element. For example, a first element may be named a second element and, similarly, a second element may be named a first element, without departing from the scope of the present disclosure.

It will be further understood that the terms "have," "include," "comprise," "having," "including," or "comprising" specify a property, a region, a fixed number, a step, a process, an element, a component, and a combination thereof but do not exclude other properties, regions, fixed numbers, steps, processes, elements, components, and combinations thereof.

In the drawing, the sizes of elements may be exaggerated for clarity. For example, the size or thickness of each element may be arbitrarily shown for illustrative purposes, and thus, the embodiments of the present disclosure should not be construed as being limited thereto.

Aspects and features of the present disclosure and methods of accomplishing the same may be understood more readily by reference to the following detailed description of embodiments and the accompanying drawing. Hereinafter, embodiments will be described in more detail with reference to the accompanying drawing. The present disclosure, however, may be embodied in various different forms, and should not be construed as being limited to only the illustrated embodiment. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art to have a complete understanding of the aspects and features of the present disclosure may not be described.

Spatially relative terms, such as "beneath", "below", "lower", "under", "above", "upper", and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g. rotated 90 degrees or at other orientations) and the spatially relative descriptors used herein should be interpreted accordingly.

It will be understood that when an element or layer is referred to as being "on", "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a", "an", and "the" are intended to include the plural forms as well, unless the context clearly indicates otherwise. Expressions such as "at least one of", when preceding a list of elements, modify the entire list of elements and do not modify the individual elements of the list.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The FIGURE shows a circuit diagram of an electric circuit for monitoring isolation resistance measurement within a high voltage (HV) board net of an electronic vehicle according to an embodiment of the present disclosure. The electric circuit includes a HV power system 10 providing a positive high voltage potential HV+ and a negative high voltage potential HV−, and a common ground potential GND/Chassis is defined in the middle between a positive isolation resistance $R_{IsoP}$ and a negative isolation resistance $R_{IsoN}$. The positive isolation resistance $R_{IsoP}$ and the negative isolation resistance $R_{IsoN}$ are connected in series and parallel to the HV power system 10 between the positive high voltage potential HV+ and the negative high voltage potential HV−.

The electric circuit further includes a positive measurement resistance $R_{0\_p}$ connected in parallel to the positive isolation resistance $R_{IsoP}$ between the positive high voltage potential HV+ and the ground potential GND/Chassis; a negative measurement resistance $R_{0\_n}$ connected in parallel to the negative isolation resistance $R_{IsoN}$ between the negative high voltage potential HV− and the ground potential GND/Chassis; a positive voltage meter $U_{BAT\_P}$ between the positive high voltage potential HV+ and the ground potential GND/Chassis; and a negative voltage meter $U_{BAT\_N}$ between the negative high voltage potential HV− and the ground potential GND/Chassis.

The electric circuit includes only a single amperemeter $I_{iso\_p}$ configured (e.g., permanently configured) to measure a positive current $I_{iso\_p}$ through the positive measurement resistance $R_{0\_p}$ between the positive high voltage potential HV+ and the ground potential GND/Chassis. The positive current $I_{iso\_p}$ through the positive measurement resistance $R_{0\_p}$ in relation to the ground potential GND/Chassis can be controlled on or off by a positive switch Pos.Iso-Switch.

In another embodiment, however, a single amperemeter $I_{iso\_n}$ is configured (e.g., permanently configured) to measure a negative current $I_{iso\_n}$ through the negative measurement resistance $R_{0\_n}$ between the negative high voltage potential HV− and the ground potential GND/Chassis. The negative current $I_{iso\_p}$ through the negative measurement resistance $R_{0\_p}$ in relation to the ground potential GND/Chassis can be controlled on or off by a negative switch Neg.Iso-Switch.

For isolation resistance measurement, based on measured voltages $U_{BAT\_P}$ (between the positive high voltage potential HV+ and the ground potential GND/Chassis) and $U_{BAT\_N}$ (between the negative high voltage potential HV− and the ground potential GND/Chassis), the respective actual isolation resistance values $R'_{IsoP}$ and $R'_{IsoN}$ of the isolation resistances $R_{IsoP}$ and $R_{IsoN}$ can also be calculated by applying Ohm's law with known nominal resistance values $R_{0\_p}$ and $R_{0\_n}$ and compared with respective known nominal isolation resistance values $R_{IsoP}$ and $R_{IsoN}$. A deviation between $R'_{IsoP}$ and $R_{IsoP}$ and/or between $R'_{IsoN}$ and $R_{IsoN}$ can be an indication of an error in the insulation resistance.

However, for monitoring the isolation resistance measurement, the current $I_{iso\_p}$ or $I_{iso\_n}$ through either the positive measurement resistance $R_{0\_p}$ or the negative measurement resistance $R_{0\_n}$ is measured with the single amperemeter $I_{iso\_p}$ and, based on the respective measured voltages $U_{BAT\_P}$ (between the positive high voltage potential HV+ and the ground potential GND/Chassis) or $U_{BAT\_N}$ (between the negative high voltage potential HV− and the ground potential GND/Chassis), the respective actual measurement resistance value $R'_{0\_p}$ or $R'_{0\_n}$ of the measured measurement resistance value $R'_{0\_p}$ or $R'_{0\_n}$ can be calculated by applying Ohm's law and compared with the respective known nominal measurement resistance value $R_{0\_p}$ or $R_{0\_n}$. A respective deviation between $R'_{0\_p}$ and $R_{0\_p}$ or between $R'_{0\_n}$ and $R_{0\_n}$ can be an indication of an error in the insulation resistance measurement.

In addition, the respective actual measurement resistance value $R'_{0\_n}$ or $R'_{0\_p}$ of the unmeasured measurement resistance $R_{0\_n}$ or $R_{0\_p}$ can be calculated by applying the respective calculated actual measurement resistance value $R'_{0\_p}$ or $R'_{0\_n}$ of the measured measurement resistance $R_{0\_p}$ or $R_{0\_n}$, the calculated actual positive isolation resistance value $R'_{IsoP}$ and the negative isolation resistance value $R'_{IsoN}$, and compared with a respective known nominal resistance value $R_{0\_n}$ or $R_{0\_p}$. A respective deviation between $R'_{0\_n}$ and $R_{0\_n}$ or between $R'_{0\_p}$ and $R_{0\_p}$ can be an indication of an error in the insulation resistance measurement. This method of monitoring isolation resistance measurement according to the disclosure includes only two high voltage measurements and only one current measurement.

| Some Reference Numerals | |
|---|---|
| 10 | HV power system (e.g., a battery systems or supply system) |
| HV+ | positive high voltage potential |
| HV− | negative high voltage potential |
| GND/Chassis | (chassis) ground |
| $R_{IsoP}$ | positive isolation resistance (value $R_{IsoP}$ nominal, $R'_{IsoP}$ measured) |
| $R_{IsoN}$ | negative isolation resistance (value $R_{IsoN}$ nominal, $R'_{IsoN}$ measured) |
| $R_{0\_p}$ | positive measurement resistance (value $R_{0\_p}$ nominal, $R'_{0\_p}$ measured) |
| $R_{0\_n}$ | negative measurement resistance (value $R_{0\_n}$ nominal, $R'_{0\_n}$ measured) |
| $U_{BAT\_P}$ | positive voltage meter (value $U_{BAT\_P}$) |
| $U_{BAT\_N}$ | negative voltage meter (value $U_{BAT\_N}$) |
| $I_{iso\_p}$ | (positive) amperemeter (value $I_{iso\_p}$) |
| $I_{iso\_n}$ | (negative) amperemeter (value $I_{iso\_n}$) |
| Pos.Iso-Switch | positive switch |
| Neg.Iso-Switch | negative switch |

What is claimed is:

1. An electric circuit for monitoring isolation resistance measurement within a high voltage board net of an electronic vehicle, the electric circuit comprising:
a high voltage (HV) power system having a positive high voltage potential and a negative high voltage potential with a common ground potential being defined between a positive isolation resistance and a negative isolation resistance, the positive isolation resistance and the negative isolation resistance being connected in series and parallel to the HV power system between the positive high voltage potential and the negative high voltage potential;
a positive measurement resistance connected in parallel to the positive isolation resistance between the positive high voltage potential and the ground potential;
a negative measurement resistance connected in parallel to the negative isolation resistance between the negative high voltage potential and the ground potential;
a positive voltage meter between the positive high voltage potential and the ground potential;
a negative voltage meter between the negative high voltage potential and the ground potential; and
only a single amperemeter configured to measure either a positive current through the positive measurement resistance between the positive high voltage potential and the ground potential, or a negative current through the negative measurement resistance between the negative high voltage potential and the ground potential.

2. The electric circuit according to claim 1, further comprising a positive switch to control the positive current through the positive measurement resistance in relation to the ground potential.

3. The electric circuit according to claim 2, further comprising a negative switch to control the negative current through the negative measurement resistance in relation to the ground potential.

4. The electric circuit according to claim 1, further comprising a negative switch to control the negative current through the negative measurement resistance in relation to the ground potential.

5. A method for monitoring isolation resistance measurement within a high voltage board net of an electronic vehicle by using the electric circuit according to claim 1, the method comprising:
measuring a first voltage with the positive voltage meter between the positive high voltage potential and the ground potential as voltage drop across the positive isolation resistance and the positive measurement resistance connected in parallel;
measuring a second voltage with the negative voltage meter between the negative high voltage potential and the ground potential as voltage drop across the negative isolation resistance and the negative measurement resistance connected in parallel;
calculating an actual positive isolation resistance value by applying a known nominal positive measurement resistance value of the positive measurement resistance and the measured first voltage;
calculating an actual negative isolation resistance value by applying a known nominal negative measurement resistance value of the negative measurement resistance and the measured second voltage;
measuring a current through either the positive measurement resistance or the negative measurement resistance with the single amperemeter and calculating a respective actual measurement resistance value of the measured positive measurement resistance or negative measurement resistance;
comparing the calculated respective actual measurement resistance value of the measured positive measurement resistance or negative measurement resistance with the respective known nominal resistance value.

6. The method according to claim 5, further comprising:
calculating a respective actual measurement resistance value of the unmeasured one of the negative measurement resistance or positive measurement resistance by applying the respective calculated actual measurement resistance value of the measured positive measurement resistance or negative measurement resistance, the calculated actual positive isolation resistance value, and the calculated negative isolation resistance value;

comparing the calculated respective actual measurement resistance value of the unmeasured one of the negative measurement resistance or positive measurement resistance with the respective known nominal resistance value.

7. The method according to claim 6, wherein the electric circuit further comprises a positive switch to control the positive current through the positive measurement resistance in relation to the ground potential, and wherein the method is applied to the electric circuit when the positive switch is closed.

8. The method according to claim 6, wherein the electric circuit further comprises a negative switch to control the negative current through the negative measurement resistance in relation to the ground potential, and wherein the method is applied to the electric circuit when the negative switch is closed.

9. A board net of an electronic vehicle, the board net comprising the electric circuit for monitoring isolation resistance measurement according to claim 1.

10. An electronic vehicle comprising the electric circuit for monitoring isolation resistance measurement according to claim 1.

11. An electric circuit for monitoring isolation resistance measurement within a high voltage board net of an electronic vehicle, the electric circuit comprising:

a high voltage (HV) power system having a positive high voltage potential and a negative high voltage potential with a common ground potential being defined between a positive isolation resistance and a negative isolation resistance, the positive isolation resistance and the negative isolation resistance being connected in series and parallel to the HV power system between the positive high voltage potential and the negative high voltage potential;

a positive measurement resistance connected in parallel to the positive isolation resistance between the positive high voltage potential and the ground potential;

a negative measurement resistance connected in parallel to the negative isolation resistance between the negative high voltage potential and the ground potential;

a positive voltage meter between the positive high voltage potential and the ground potential;

a negative voltage meter between the negative high voltage potential and the ground potential; and an amperemeter between the positive measurement resistance and the common ground, the amperemeter being configured to measure a positive current through the positive measurement resistance between the positive high voltage potential and the ground potential, wherein no amperemeter is between the negative measurement resistance and the common ground.

12. The electric circuit according to claim 11, further comprising a positive switch to control the positive current through the positive measurement resistance in relation to the ground potential.

13. The electric circuit according to claim 12, further comprising a negative switch to control a negative current through the negative measurement resistance in relation to the ground potential.

14. The electric circuit according to claim 11, further comprising a negative switch to control a negative current through the negative measurement resistance in relation to the ground potential.

* * * * *